United States Patent [19]

Love et al.

[11] Patent Number: 4,465,575

[45] Date of Patent: Aug. 14, 1984

[54] METHOD FOR FORMING PHOTOVOLTAIC CELLS EMPLOYING MULTINARY SEMICONDUCTOR FILMS

[75] Inventors: Robert B. Love; Uppala V. Choudary, both of Chatsworth, Calif.

[73] Assignee: Atlantic Richfield Company, Los Angeles, Calif.

[21] Appl. No.: 470,418

[22] Filed: Feb. 28, 1983

Related U.S. Application Data

[63] Continuation-in-part of Ser. No. 304,520, Sep. 21, 1981, abandoned.

[51] Int. Cl.$^3$ .................. C23C 15/00; H01L 31/18
[52] U.S. Cl. ............................ 204/192 S; 136/260; 136/264; 136/265; 204/192 P; 204/298
[58] Field of Search .................. 204/192 S, 192 P; 136/260, 264, 265; 427/74, 76, 87

[56] References Cited

U.S. PATENT DOCUMENTS 4,398,055 8/1983 Ijaz et al. ...................... 136/258

Primary Examiner—Aaron Weisstuch

Attorney, Agent, or Firm—Nilsson, Robbins, Dalgarn, Berliner, Carson & Wurst

[57] ABSTRACT

At least two constituent elements of a semiconductor compound are deposited in varying proportions by magnetron sputtering to produce a film having a preselected concentration gradient of the constituent elements. The film can be heat treated during or after deposition to diffuse the constituent elements within the film and enhance growth of a desired film structure. The sputtering step may be performed using a planar magnetron having a plurality of continuous magnetically enhanced sputtering cathodes extending about a common axis. Each of the cathodes includes a source structure containing at least one of the constituent elements, and provision for applying electrical power to the source structure to sputter the constituent element at a controlled rate. If one of the elements is difficult to control in the deposition process, it can be sputtered from a cathode made up of a stable alloy of the element and another constituent of the film. For example, when the semiconductor compound is $CuInSe_2$, two of the sputtering cathodes may comprise $In_2Se_3$ and $Cu_2Se$, respectively, and a third optimal cathode comprises either Cu or In.

13 Claims, 8 Drawing Figures

METHOD FOR FORMING PHOTOVOLTAIC CELLS EMPLOYING MULTINARY SEMICONDUCTOR FILMS

The present application is a Continuation-In-Part of copending U.S. patent application Ser. No. 06/304,520, filed Sept. 21, 1981 and now abandoned by the inventors herein, for Method and Apparatus For Forming Photovoltaic Cells Employing Composition-Graded Semiconductor Films.

BACKGROUND OF THE INVENTION

The invention relates generally to the semiconductor art and, more particularly, to an improved method and apparatus for forming thin film photovoltaic cells employing multinary materials, such as I-III-VI$_2$ Cu-ternary chalcopyrite compounds. The compounds of particular interest in this area include, without limitation, $CuAlS_2$, $CuGaSe_2$, $CuInS_2$, $CuInSe_2$ and $CuInTe_2$. Of these, $CuInSe_2$ is the most promising.

In the relatively recent past, considerable interest has been directed to the use of $CuInSe_2$ in photovoltaic devices. The following publications and patent relate to two recent efforts in this area:

1. Chen and Mickelsen, "Thin Film CdS/CuInSe$_2$ Heterojunction Solar Cell", *SPIE*, Volume 248, Pages 62–69 (1980);
2. Mickelsen et al. U.S. Pat. No. 4,335,266;
3. Piekoszewski, et al., "Rf-Sputtered CuInSe$_2$ Thin Films", Conference Record, 14th IEEE Photovoltaic Specialists Conference, pages 980–985 (1980);

Although CuInSe$_2$ is theoretically promising for use in photovoltaic cells, most of the prior thin-film devices incorporating it have proven relatively inefficient. As pointed out in the article by Chen and Mickelsen, the inefficiency is believed to stem in large part from the existence of imperfections, such as voids, vacancies and nodules of copper, at the junction of p-type CuInSe$_2$ with n-type CdS in the devices. Specifically, it has been found that when a conventional low resistivity (less than 50K ohms per square) p-type CuInSe$_2$ film is exposed to CdS, a large number of nodules of pure copper are produced at the junction between the layers. Solar cells containing nodules of this type have exhibited low solar to electrical energy conversion efficiency.

In order to avoid the formation of nodules, Chen and Mickelsen deposited CuInSe$_2$ films in two steps in the fabrication of CuInSe$_2$/CdS cells. Cu, In and Se were deposited by co-evaporation to form each of the two layers, with the deposition rate of Cu adjusted between the two layers in a single step. A low resistivity layer (less than 50K ohms per square) was deposited to a depth of approximately one micron, with a second layer of much higher resistivity deposited thereover to complete the selenide film. The change in resistivity was accomplished by adjusting the Cu evaporation rate during deposition. A substrate temperature of 450 degrees Celsius was attained during this process, presumably to aid in formation and diffusion of the composition-graded selenide film. A film of CdS was then deposited over the high resistivity portion of the selenide film to form a thin film solar cell reportedly having a relatively high efficiency.

In the *SPIE* article, Chen and Mickelsen disclose that the exact nature of the composition gradient produced by their method is determined by the relative Cu and In deposition rates, the relative layer thicknesses and the substrate temperature. The last of these variables is stated to be important since diffusion processes are active at high substrate temperatures.

Although the efforts of Chen and Mickelsen have yielded good experimental results with laboratory devices, the process is difficult to control and does not lend itself to efficient large scale production. In particular, the process involves thermal evaporation, which is very difficult to control in multi-component depositions. Evaporation is basically a boiling process which proceeds rapidly at rates proportional to the vapor pressure of each component. The system also possesses substantial inertia, causing it to respond slowly to changed input. However, a small change in input power eventually produces a significant change in evaporation rate. According to Chen and Mickelsen, deposition of CuInSe$_2$ by thermal evaporation also involves substrate temperatures on the order of 450 degrees Celsius, presumably to foster crystal growth. Temperatures of this magnitude severely constrain a production environment and increase the cost of the process. Finally, streams of Cu, In and Se produced by thermal evaporation are difficult to controllably mix during deposition to control composition of the deposited film. The Cu, In and Se approximate point sources and have considerably different diffusion properties. The sources are therefore placed in complex spatial relationships with each other in an attempt to achieve adequate mixing. One possible source configuration is disclosed in the *SPIE* article. Elaborate devices are required for continuously sensing and controlling evaporation.

As described in the article by Piekoszewski et al., the compound CuInSe$_2$ has been deposited onto a substrate by radio-frequency or "rf" sputtering to form a thin homogeneous film of a photovoltaic device. Rf-sputtering is a method by which ions from an rf-excited plasma are caused to impact a source or target material, vibrating atoms of the source material loose for deposition on a substrate. The atoms possess high kinetic energy and are intercepted by the substrate to form a deposited film.

The device described in Piekoszewski et al. was produced by rf-sputtering CuInSe$_2$ from a specially prepared single source or target, and subsequently depositing a CdS film thereon. The single source of CuInSe$_2$ made it impossible to vary the Cu/In ratio during deposition, giving the deposited film a uniform CuInSe$_2$ composition. The device made with the film exhibited a low energy conversion efficiency, presumably due to Cu nodule formation and other defects. Rf-sputtering is poorly suited for use in large scale commercial systems, due to the level of rf power which must be applied to the source material to induce sputtering. Power on the order of 100 KW is usually required to generate a plasma and produce large scale rf sputtering. While this level of power can be accommodated in a laboratory situation such as that described by Piekoszewski et al., it is difficult to set up and control in a production sputtering system. For example, the transfer of high levels of rf power to a sputtering cathode is an inherently inefficient process. The impedance match between the power generator and the load is very critical, and there is always some power reflected back to the generator. Also, there are significant losses due to capacitive coupling between an rf cathode and ground. These problems are serious at high power levels, and are responsible for the fact that rf-sputtering has not been used in large scale production.

A process known as planar magnetron sputtering, also called magnetically enhanced sputtering, has been used to produce sputtering films of uniform composition in the manufacture of certain electronic devices and the application of reflective coatings to glass. The current level of technology in the magnetron sputtering field is evident from the following-listed article and United States patents: Chapin, "The Planar Magnetron", *Research/Development*, pages 37-40, January 1974; U.S. Pat. Nos. 3,878,085, 3,956,093, 4,060,470, 4,100,055, 4,116,806 and 4,162,954.

Magnetron sputtering involves the use of a magnetic field to trap electrons above a source, forming an intense plasma from which positive ions are drawn into impact with the source. The intensity of the plasma, and thus the rate at which ions collide with the source to produce sputtering, can be controlled accurately by controlling the electric power applied to the source.

Most of the magnetron sputtering devices and methods of which applicant is aware relate to sputtering a film of uniform composition. However, any $CuInSe_2$ film deposited in the first instance as a film of uniform composition would necessarily exhibit the above-referenced Cu Nodule formation when used in conjunction with a CdS film. It is also believed that magnetron sputtering techniques have not been used to deposit $CuInSe_2$ or any other ternary chalcopyrite compound employing materials selected from the chemical groups I, III and VI, respectively.

Anderson et al., "Magnetron Reactive Sputtering Deposition of $Cu_2S$/CdS Solar Cells", *Proceedings, 2nd European Community Photovoltaic Solar Energy Conference*, Pages 890-897 (1979), discloses a system in which a number of magnetron sputtering cathodes are used to sequentially deposit films of $Cu_2S$, CdS and Nb. The cathodes are operated separately for sequential deposition of $Cu_2S$ and CdS in a reactive atmosphere containing S. The only instance in which two of the cathodes are operated simultaneously is the deposition of In-doped CdS films by co-sputtering Cd and In targets in a reactive $H_2S$ atmosphere. Indium was used only as a dopant in the production of films of uniform concentration, and was present in extremely small quantities. Under these circumstances, it is believed that the parameters of mixing are much less critical than in the case of depositing the major constituent elements of a highly composition-dependent multinary material, such as $CuInSe_2$.

U.S. Pat. No. 4,322,276 to Meckel et al. discloses a method of forming a thin film refractive coating wherein the composition of a metal and its oxide within the film varies as a function of depth. Deposition is accomplished by passing a continuous flexible substrate over a series of magnetron sputtering cathodes containing different compositions of the metal and the oxide. The cathodes are separated for sequential deposition onto the passing substrate, except for a small area of overlap.

U.S. Pat. No. 4,278,528 to Kuehnle et al. discloses a system in which a number of materials are deposited as discrete parallel strips from a plurality of rf sputtering cathodes.

Japanese Pat. No. 55-12732 to Funaki discloses a variety of sputtering cathode structures containing more than one material. However, it appears that each of the structures is a single electrically conductive unit, preventing individual control of the rates at which the materials are sputtered. Therefore, they would not be suitable for depositing composition-graded films of multinary materials.

Finally, mention is made in Leong et al., "Advances in the SERI/DOE program on CdS/$Cu_2S$ and CdS/Cu-ternary Photovoltaic Cells", *15th IEEE Photovoltaic Specialists Conference*, pages 1016-1020, August 1981, of reactive magnetron sputtering. The article describes cells fabricated by thermal evaporation processes, and lists reactive magnetron sputtering as one of the other methods currently being pursued "within the CdS program". However, the discussion following the list, and the data entries of Table 2, describe sputtering only in connection with a CdS/$Cu_2S$ cell in which each layer is generally homogeneous. The layers are formed by reactive sputtering of the metallic element (Cd or Cu), in an atmosphere containing $H_2S$. The article therefore appears to be irrelevant to codeposition of a number of constituent elements of a multinary semiconductor, such as $CuInSe_2$, in composition-graded form. In any event, it is believed that the Leong et al. publication is not prior art to the present invention because it was published after conception of the present invention and applicants exercised diligence in reducing the invention to practice.

Therefore, it is desirable to provide an improved method and apparatus for accurately and controllably depositing a high quality composition-graded film of a multinary semiconductor material, such as $CuInSe_2$.

Summary of the Invention

The method of the present invention is useful in the manufacture of photovoltaic cells having a film of a multinary semiconductor compound, such as as a Cu-ternary material, made up of a plurality of distinct constituent elements. The method comprises the steps of magnetron sputtering at least two constituent elements of the compound simultaneously onto a substrate in a first preselected proportion; and subsequently magnetron sputtering the two constituent elements in at least one other preselected proportion; whereby a composite sputtered film having a preselected concentration gradient of at least one of the constituent elements is produced on the substrate. In a preferred embodiment, the sputtering steps are performed at room temperature and the composite film is subsequently heat treated to crystallize it and produce diffusion therein. When the multinary semiconductor compound is a Cu-ternary compound containing at least one Group III element, heat treatment is carried out at a temperature of at least approximately 350 degrees Celsius. When the Cu-ternary compound includes a Group VI element, the constituent elements may be sputtered from stable alloys containing the Group VI element. In the case of $CuInSe_2$, the alloys may comprise $Cu_2Se$ and $In_2Se_3$.

The step of sputtering the constituent elements in at least one other preselected proportion may be accomplished by varying the relative sputtering rate of at least one of the constituent elements during the sputtering process. The sputtering rates are preferably varied by individually varying the electrical power applied to a number of different planar magnetron cathodes containing the respective constituent elements. In some cases, the concentration gradient of the composite film, as deposited, is a smoothly varying function of film depth.

The apparatus of the present invention comprises: at least one planar magnetron arrangement having a plurality of continuous magnetically enhanced sputtering means extending about a common axis; a first of the sputtering means comprising a source structure adapted to contain at least one of the constituent elements of the film to be deposited, and means for applying a first level electric power to the source structure to sputter the constituent element at a first preselecte rate; and a second of the sputtering means comprising a source structure adapted to contain at least one other constituent element of the film, and means for applying a second level electric power to the source structure to sputter the other constituent element at a preselected rate; whereby a plurality of the constituent elements can be sputtered simultaneously by each of the magnetron arrangements in preselected proportions determined, in part, by the power levels, for deposition onto a substrate.

The magnetron sputtering method of the present invention permits any desired concentration gradient or proportion of elements to be accurately and reproducibly achieved in a deposited film as a function of film depth. The problems outlined above regarding the existence of Cu nodules and other imperfections at the junctions of $CuInSe_2$/CdS devices can be avoided by causing the $CuInSe_2$ layer, as initially deposited, to have a region of reduced Cu concentration where the layer is to abut the p-n junction. The composition of deposited material can be controlled continuously during the sputtering process by controlling the power applied to the various cathodes. This is possible because the sputtering rate of each element is governed by the level of power applied to the corresponding cathode, and the rate responds almost instantaneously to changes in power.

The process of the present invention is easily scaled up for production when the apparatus of the invention is used. Because the sputtering means or "racetracks" extend continuously about a common axis, the constituent elements are efficiently mixed as they are sputtered, producing a uniform deposited film. Each magnetron arrangement is a source of a fully mixed stream of material in which the relative proportions of sputtered elements can be varied by varying power to the cathodes.

The process of the present invention is also relatively energy efficient because it can be carried out at substantially lower temperatures than those required in the thermal evaporation process of Chen and Mickelsen. The lower temperature is made possible, in part, by the fact that the sputtered particles possess a higher kinetic energy than do evaporated particles. Typically, particles arriving at a substrate surface by magnetron sputtering possess an energy in the neighborhood of 10–40 electron volts, while evaporated particles arrive with a kinetic energy of approximately 0.2 to 0.3 electron volts. At the atomic level, this additional kinetic energy is indistinguishable from thermal energy possessed according to the relation $E = \frac{1}{2}kT$, and serves the same purpose as a higher temperature in permitting the sputtered elements to move about sufficiently on the substrate to assume a desired position in the structure of the deposited film.

The inefficiencies described above in relation to rf-sputtering are not encountered in the process of the present invention because the power involved in magnetron sputtering is usually direct current (dc) power which is easily controlled at high power levels.

If desired, the process of the present invention can be carried out at room temperature, followed by heat treatment at 350 degrees Celsius, or above. In that case, the constituent elements are deposited as an amorphous mix having a preselected concentration gradient as a function of depth, and thereafter heated to diffuse the elements within the film and enhance its molecular structure. This method is advantageous because it eliminates the requirement for substrate heat within the deposition environment. If the substrate must be exposed to heat at some point, it is far easier and less expensive to do so in a furnace, after deposition, than to heat the substrate in a vacuum coating chamber. Temperature-related problems of mechanical motion systems (conveyors, etc.) are particularly acute in a vacuum environment. Such problems include high friction and volatilization of lubricants. Temperature uniformity and gas composition at high temperature are also easier to control in a furnace than in a vacuum system, and the cycle time required to heat up and cool down the substrates is not as expensive in a furnace. A large throughput can be handled in a furnace at a reasonable cost by designing the furnace to handle a very large load. Finally, selenium deposition, which is a problem at high temperature because of its vapor pressure and tendency to scatter, is much more controllable at room temperature.

The post-deposition heat treatment described above tends to smooth out the gradient in film composition and, in many cases, produces a film which appears macroscopically homogeneous under Auger analysis. However, it is believed that there may be a remaining inhomogeneity or other characteristic film structure at the doping level which is responsible for the results obtained with $CuInSe_2$ films deposited according to the invention. The results are far superior to those obtained when similar films are deposited in the first instance without depthwise concentration gradient.

Although the films deposited from $Cu_2Se$ and $In_2Se_3$ targets usually have adequate or excess Se for $CuInSe_2$, depending on the ratio of Cu to In in the films, heat treatment has been carried out in an atmosphere containing $H_2Se$ to assure full "selenization" of the film. Such heat treatment either introduces Se into the film or pulls excess Se out of the film, as required to reach the stoichiometric ratio of $CuInSe_2$. At the same time, the treatment produces a desired chalcopyrite structure within the film and smooths out the composition gradient therein.

The use of stable alloy targets in the method of the present invention permits controlled deposition of a particular constituent element which otherwise would be very difficult to control. Thus, the sputtering rate of Se can be tied to the sputtering rates of Cu and In in the deposition of $CuInSe_2$, by using targets made of $Cu_2Se$ and $In_2Se_3$. These alloys are very stable and have much higher melting points than Se, permitting them to be sputtered at a controlled rate to produce a vapor stream containing the respective elements in their stoichiometric ratios. The proportions of elements sputtered from the cathodes are determined by the power supplied to each cathode and the relative abundance of elements in the alloys, permitting accurate control of composition in the sputtered film. Increased flexibility in controlling film composition can be achieved with a third cathode of either Cu or In.

BRIEF DESCRIPTION OF THE DRAWINGS

The above and other objects of the present invention may be more fully understood from the following detailed description, taken together with the accompanying drawings, wherein similar reference characters refer to similar elements throughout and in which.

DESCRIPTION OF THE PREFERRED EMBODIMENTS

The present invention comprises primarily an improvement on the method of the Chen and Mickelsen article and Mickelsen et al. U.S. Pat. No. 4,335,266, discussed above, and a planar magnetron apparatus for implementing the improved method. The cited article and patent are hereby incorporated by reference.

Figure 1:
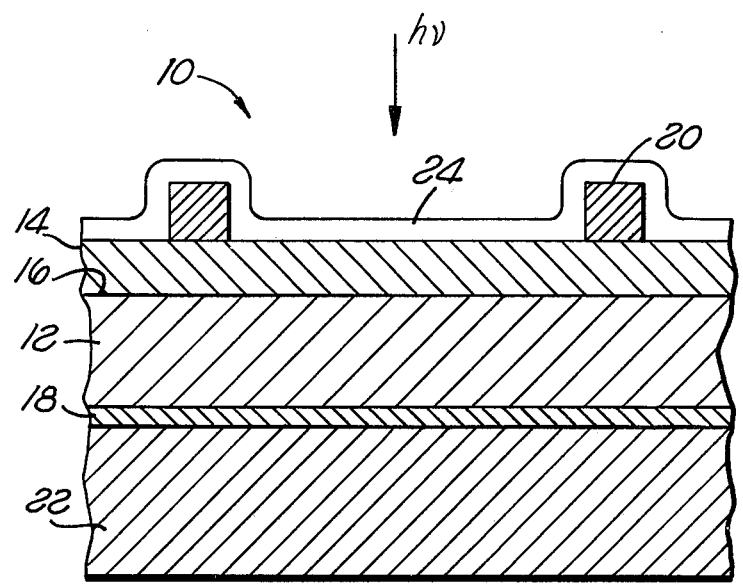
FIG. 1 is a somewhat diagrammatic fragmentary sectional view of a thin film p-n junction device constructed in accordance with the method of the present invention.

Referring now to the drawings, there is illustrated, in FIG. 1 thereof, a thin film p-n photovoltaic cell constructed in accordance with the method of the present invention, and generally designated 10. The cell 10 comprises a pair of semiconductor layers or films 12 and 14 defining a p-n junction 16 therebetween. The layer 12 is preferably a single phase p-type chalcopyrite film which is produced by magnetron sputtering techniques and initially defines a preselected composition gradient. The gradient is chosen to prevent the formation of nodules or other surface imperfections at the junction 16 and may be altered or eliminated by subsequent heat treatment, if desired. The layer 14 is preferably CdS. The layers 12 and 14 are positioned between a base contact 18 and an upper contact grid 20. The base contact 18 is itself superimposed over a substrate 22, and the cell is covered with an anti-reflective (AR) coating 24.

Figure 2:
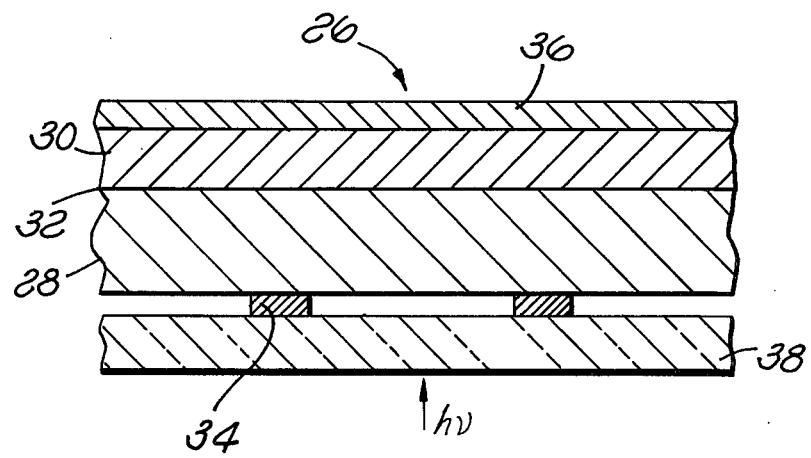
FIG. 2 is a somewhat diagrammatic fragmentary sectional view of a thin film n-p junction device constructed in accordance with the method of the present invention.

FIG. 2 illustrates an alternative form of device constructed according to the method of the present invention, generally designated 26. The cell 26 comprises an n-type semiconductor layer 28 and a p-type chalcopyrite layer 30 forming an n-p junction 32. The layers 28 and 30 are positioned between a base contact grid 34 and an upper contact layer 36. The contact grid 34 is formed on a transparent substrate 38 through which incident radiation (hv) enters the cell 26.

The cells 10 and 26 are functionally similar; however, the various layers and contacts of the cells are applied to the substrates in different orders. The novel process and apparatus of the present invention, which relates to formation of one of the semi-conductor layers, will be discussed specifically in relation to the cell 10 with the understanding that it also applies generally to the cell 26.

It will be understood that the illustrations of the cells 10 and 26, respectively, are representative of prior art photovoltaic cells as well as the cells of the present invention. The cells 10 and 26 differ from the prior art primarily in the nature of the layers 12 and 30, respectively, and the process by which they are formed. Because the layers 12 and 30 are formed by the novel magnetron sputtering method of the present invention, they are very high in quality, can be given virtually any desired composition gradient, and can be adapted to suit the requirements of virtually any cell.

Referring to FIG. 1, the semiconductor layer 12 may be made of a chalcopyrite Cu-ternary material, such as $CuInSe_2$, and has a composition which initially varies as a function of film depth. The layer 12 extends from a Cu-enriched region adjacent the base contact 18 to a relatively Cu-deficient region at the junction 16, giving it a low resistivity at the base contact and a relatively high resistivity at the junction. In one embodiment, the Cu concentration within the layer 12 varies smoothly and continuously as a function of depth, ranging between values which would yield sheet resistivities of between 0.5K ohms per square and $10^3$K ohms per square, if formed in sheets 2 to 3 microns thick. The Cu concentration is then within approximately 5 percent of the stoichiometric concentration of Cu in $CuInSe_2$. Because the electrical properties of $CuInSe_2$ are very sensitive to the ratio of Cu to In, variations in the Cu/In ratio of only a few percent produce resistivity gradients on the order of $10^4$ or $10^5$. In another embodiment, the layer 12 is deposited in two steps to produce a composition profile which is a step function of film depth. The composition profile is similar to concept to that disclosed by Chen and Mickelsen, but can be more accurately and economically produced by the method disclosed herein. The layer can then be heat treated to smooth out the profile and give the material a desired chalcopyrite structure.

In either embodiment described above, an initial deficiency of Cu is provided at the surface of the layer 12 which later forms the junction 16. This deficiency enhances the performance of the cell 10, even if the layer 12 is subsequently heated to diffuse the constituent elements therein. In fact, the highest quality $CuInSe_2$ cells produced by the applicants herein have been heat treated until the layers 12 were macroscopically homogeneous, in the sense that any inhomogeneity was so small that it could not be detected by conventional Auger mass spectroscopy. Although the layers produced in this way might possess an inhomogeneity or other characteristic film structure at doping levels, i.e., at levels involving concentration gradients between approximately $10^{-17}$ and $10^{-19}$ atoms per $cm^{-4}$, they do not suffer from the adverse effects described by Chen and Mickelsen. However, if the layer 12 were initially deposited as a homogeneous layer of $CuInSe_2$ having the same overall composition, and thus a relatively low resistivity, a great many adverse surface conditions would exist at the interface with the CdS layer 14. For example, $CuInSe_2$ films having uniform resistivities less than approximately 50K ohms per square at the time of deposition have been found to exhibit a large number of Cu nodules when exposed to CdS, causing photovoltaic cells made from them to suffer from low efficiency. Precise control of the deposition process as a function of layer depth is thus necessary to maximize cell efficiency and to assure consistency in cell production.

Figure 3:
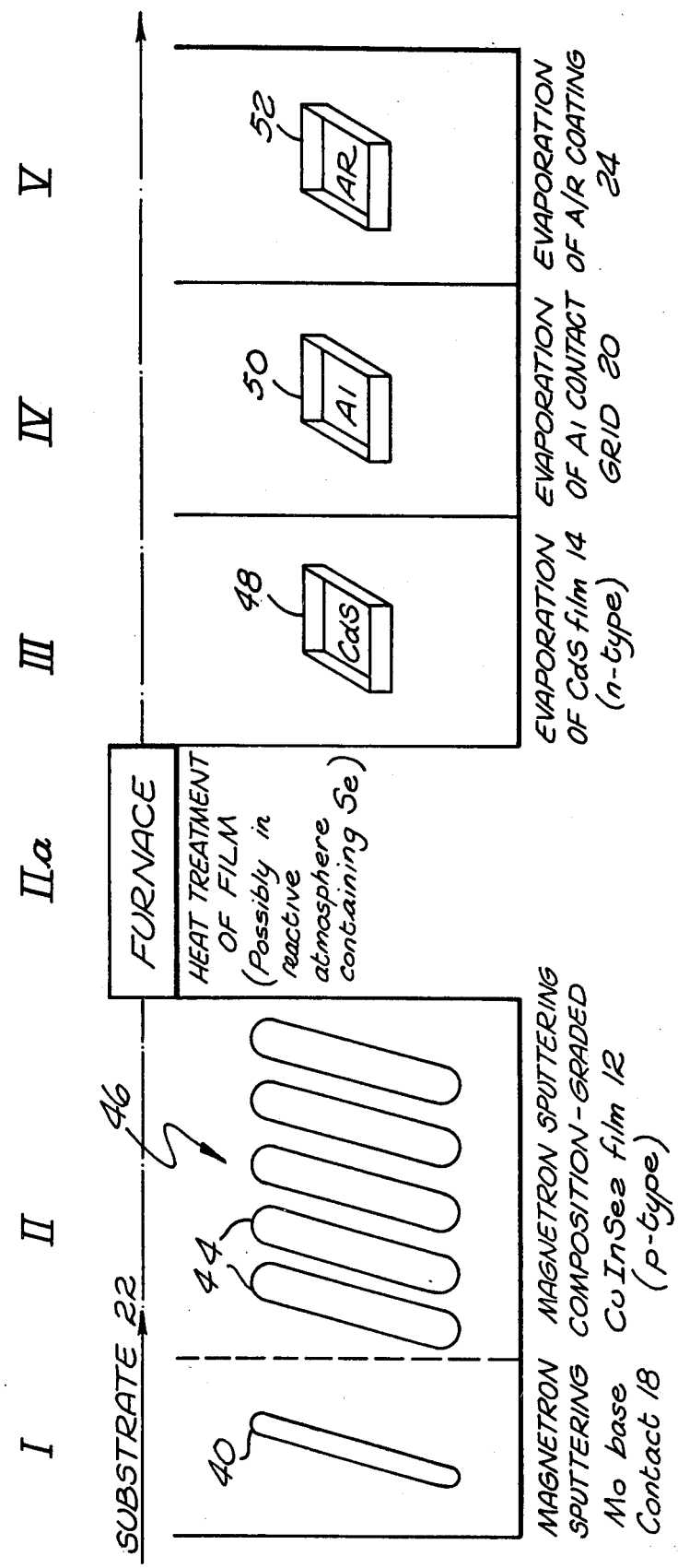
FIG. 3 is a diagrammatic representation of the method of the present invention, particularly as it would be practiced on a commercial scale.

The cell 10 is manufactured by depositing layers of various materials on the substrate 22 in the order shown in FIG. 3. FIG. 3 illustrates a manufacturing process having deposition stages I through V, the process being adapted for use on a large commercial scale.

The substrate 22 is preferably a sheet of polycrystalline alumina ($Al_2O_3$) approximately 0.025 inches thick. However, glass, enameled steel, metallic foil or other suitable material may also be used. In the case of the n-p cell 26 of FIG. 2, the substrate 38 is made of glass or similar material permitting transmission of light therethrough.

The base contact 18 may be made of molybdenum (Mo), a Mo/Au alloy, or more conventional nickel or graphite materials, and is deposited by magnetron sputtering or other suitable technique onto the substrate 22. This step, shown at stage I of FIG. 3, involves the use of one or more magnetron cathodes 40 which are shown diagrammatically in FIG. 3. The cathodes 40 may be of conventional construction and may operate in the same partial pressure of argon as the sputtering arrangements described below in connection with stage II.

At stage II of FIG. 3, the layer 12 is applied over the base contact 18 using magnetron sputtering techniques. The layer is initially provided with a composition gradient, either by varying the relative sputtering rates of the different constituent elements over time or passing the substrate over a number of magnetron sputtering arrangements 44 which are adapted to sputter the constituent elements in different preselected proportions. An apparatus 46 containing the sputtering arrangements 44 is shown diagrammatically in FIG. 3 and illustrated in more detail in FIG. 4. In the sputtering process of the present invention, the sputtering rates of the individual elements can be controlled within a few parts per million (ppm). It is therefore possible to deposit a single-phase chalcopyrite layer in which the resistivity varies uniformly as a function of film depth or, in the alternative, to deposit a layer whose resistivity varies as a step or other function. The thickness of the layer 12 is preferably on the order of 3 microns, and the portion of the layer furthest from the base contact initially has a relatively high resistivity (i.e., a Cu/In ratio which would yield a sheet resistivity 50K ohms per square if formed in a sheet 2 to 3 microns thick).

As shown at stage IIa, the deposition of stage II is followed by an optional heat treatment of the deposited film within a furnace to enhance its molecular structure and aid in diffusion. The constituent elements can be sputtered at room temperature in stage II to produce an amorphous mix having a specific concentration profile, and subsequently heated in stage IIa to produce a desired film structure and final concentration profile. The heat treatment also drives out any excess concentration of one or more volatile constituent elements of the film. Temperatures of 350° to 500° Celsius, continued for a period between 15 minutes and 2 hours, are suitable in the case of $CuInSe_2$. If desired, heat treatment can be conducted in a reactive atmosphere containing one of the constituent elements of the material, for the purpose of supplementing the concentration of the element in the film. Thus, the reactive atmosphere used in connection with $CuInSe_2$ may contain $H_2Se$, eliminating any deficiency of Se in the film. At the temperature of heat treatment, it is believed that $H_2Se$ molecules break apart upon contact with the deposited layer, causing Se atoms to be absorbed into the film. This process proceeds rapidly because Se diffuses well at the relevant temperatures.

Alternatively, it may be desirable to sputter the constituent elements of the layer 12 (stage II) at a temperature great enough to form a chalcopyrite molecular structure at the deposition surface. Subsequently, stress within the layer can be relieved by heat treatment at a temperature lower than that required to produce diffusion. A temperature of 100° Celsius, or less, is suitable for this purpose.

The n-type layer 14 is applied at stage III of FIG. 3, by thermal evaporation or other suitable means, to a depth of approximately 2 to 3 microns. The technique of thermal evaporation is adequate because the n-type layer 14 is a homogeneous layer of uniform concentration. As shown in FIG. 3, CdS or other suitable n-type material can be placed in a conventional evaporation boat 48 and essentially boiled to produce a stream of CdS vapor. Because the portion of the layer 12 adjoining the n-type CdS layer was relatively Cu-deficient when originally deposited, Cu nodules or other surface defects are not produced in any substantial number at the p-n junction.

The contact grid 20 is preferably made of aluminum applied to the layer 14 by conventional throughmask vacuum deposition techniques from an evaporation boat 50. The grid lines are applied to a depth of approximately 2 microns and are approximately 25 microns wide. Satisfactory results are achieved with 5 to 10 such lines per centimeter. Aluminum is commonly used for this purpose because it exhibits both high conductivity and excellent ohmic contact characteristics. Alternatively, a material such as indium chromium or molybdenum may be used to form an interface between the layer 14 and a superimposed electrode material such as copper, silver or nickel.

At stage V of FIG. 3, fabrication of the cell 10 is completed by applying the antireflective (AR) coating 24 thereto. The coating may comprise any suitable transparent material having a low reflectivity with respect to solar radiation. Conventional AR coatings include oxides of silicon, aluminum, indium, tin, and tantalum. The Ar coating may be applied by thermal evaporation from a boat 52, or by any other suitable technique.

Stages III, IV and V of FIG. 3 represent conventional processes which are well known in the semiconductor field. The details of the processes will therefore not be discussed herein.

In addition to stages I through V of FIG. 3, it may be desirable to subject the substrate 22 to a separate low temperature annealing step after stage V. The annealing step is preferably accomplished at no more than 100° C., and may take place either in air or in a vacuum. Annealing after stage V can enhance the structure of either semiconductor layer, improve the semiconductor junction and improve the interface between the contacts and the semiconductor layers.

The photovoltaic cell 26 is manufactured using the method steps of FIG. 3, but in essentially the opposite order. The contact grid 34 is first deposited on the transparent substrate 38 in the manner of the grid 20 of the cell 10. The layer 28, the layer 30, and the upper contact layer 36 are then applied in the manner of the layer 14, the layer 12, and the contact 18, but in the reverse order. The initial composition gradient of the layer 30 is also reversed from that of the layer 12 to place the relatively Cu-deficient region adjacent the layer 28.

The method and apparatus of the present invention is uniquely adapted to production of the cell 26 because the layer 30 is applied after the other semiconductor layer 28. Since the magnetron sputtering method of the present invention can often be performed at lower temperatures than conventional deposition and diffusion processes, the layer 30 can be deposited by the method without damage to the layer 28. Of course, high temperature heat treatment would usually not be suitable for use in producing the cell 26 because it might damage the other elements of the cell and the n-p junction within the cell.

Figure 4:
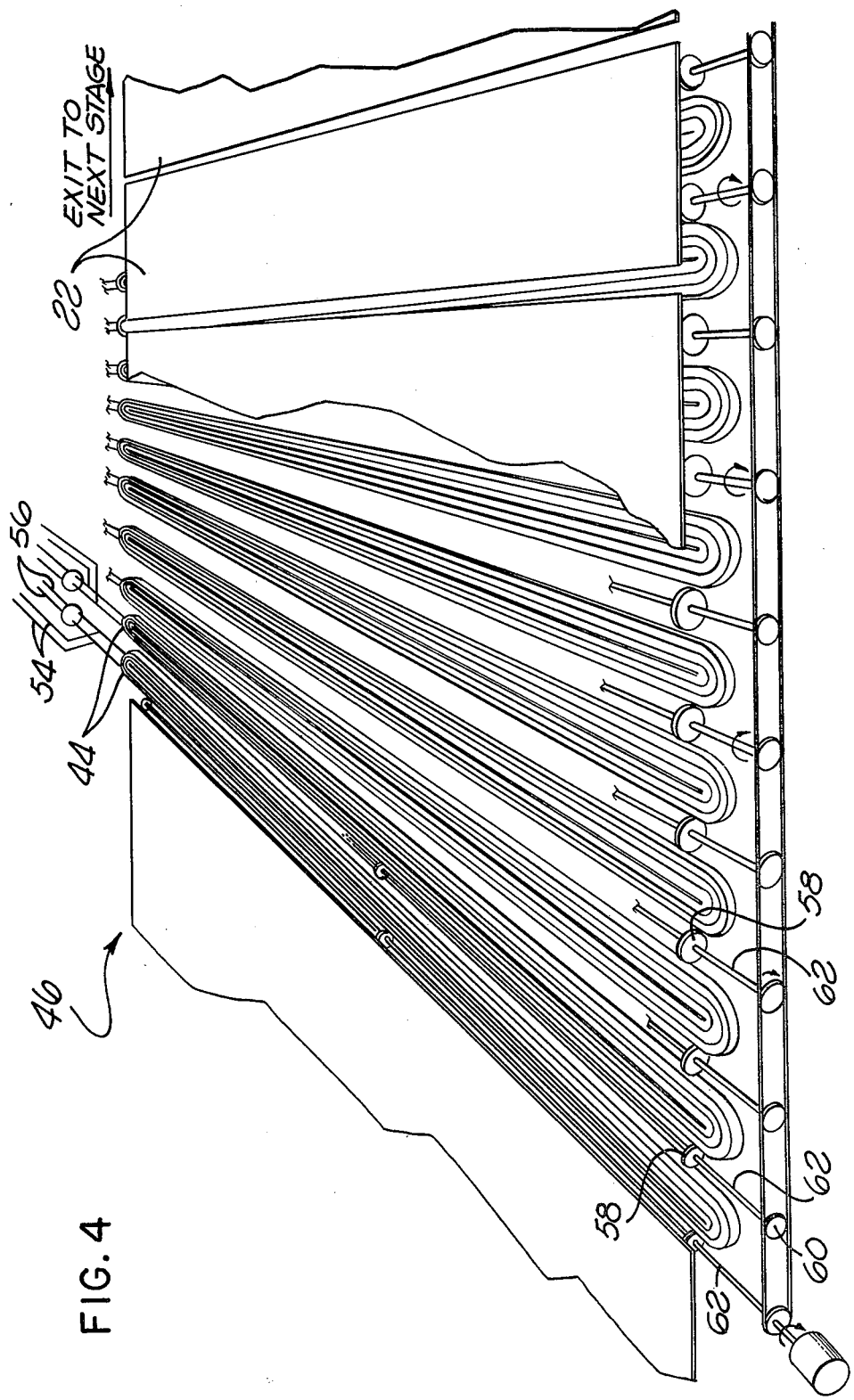
FIG. 4 is a perspective view, partially broken away, of a preferred apparatus for magnetron sputtering a composition-graded multinary film according to the method of FIG. 3.

A significant aspect of the present invention involves accomplishing the magnetron sputtering process of stage II with the apparatus 46 of FIG. 4. The apparatus 46 comprises a plurality of the magnetron sputtering arrangements 44 positioned side-by-side to deposit the constituent elements of the layer 12 onto a series of substrates 22 passed transversely over the apparatus. Each of the sputtering arrangements simultaneously sputters two or more constituent elements of the layer 12 in preselected proportions. Each is supplied with electric power by a plurality of power lines illustrated diagrammatically at 54, the power being applied through fluid conduits 56 which carry water or other cooling fluid through the arrangements 44. The substrates are conveyed over the sputtering arrangements by a number of wheels 58 positioned between the sputtering arrangements. The wheels may be driven for rotation intermittently or at a uniform rate by a suitable drive means, such as a chain and sprocket mechanism 60 and a series of drive shafts 62.

The undersides of the substrates receive sputtered material from each of the magnetron sputtering arrangements 44 as they pass thereover. Alternatively, the sputtering arrangements 44 can be suspended upside-down to sputter downwardly as the substrates are conveyed thereunder. The sputtering contributions of the arrangements 44 are cumulative, building upon each other to form the chalcopyrite layer 12. The "as deposited" layer 12 thus has a depthwise composition gradient which reflects the relative proportions of constituent elements sputtered by the various arrangements. Individual control of the proportion of elements sputtered by each arrangement, in conjunction with control of the rate at which the substrates are conveyed, permit virtually any desired composition gradient to be produced in the layer 12. Furthermore, the apparatus 46 permits the layer 12 to be deposited in a continuous process suitable for use on a commercial scale.

Figure 5:
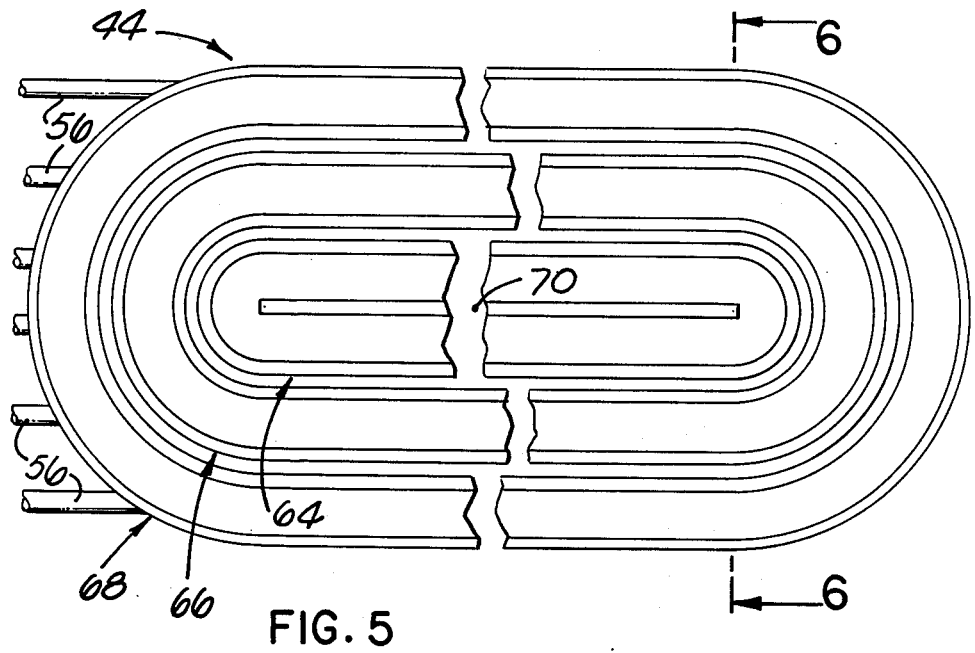
FIG. 5 is a fragmentary top plan view of one of the planar magnetron arrangements illustrated in FIG. 4, with the heat shields and anodes removed.
Figure 6:
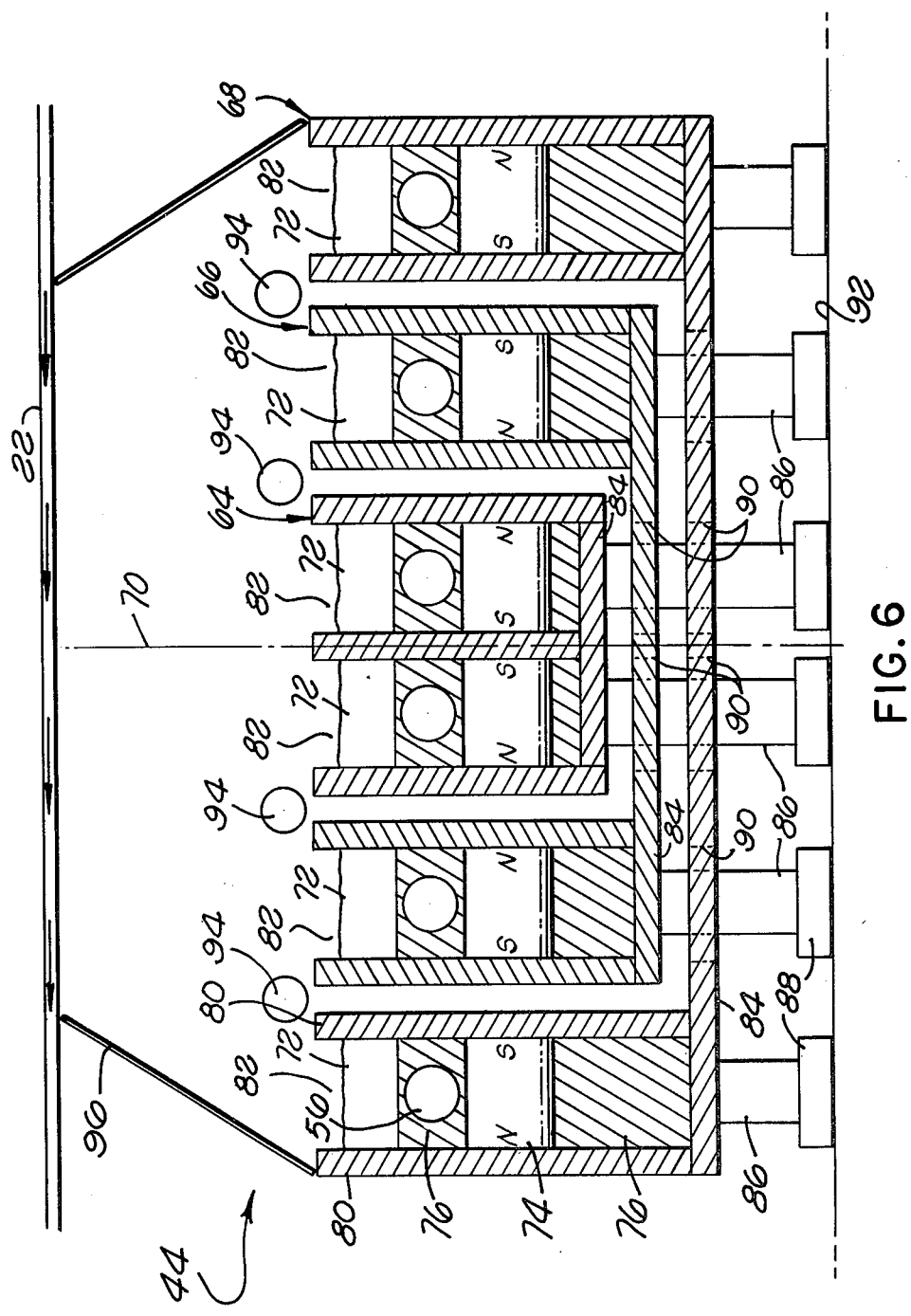
FIG. 6 is a vertical sectional view taken along the line 6—6 of FIG. 5.

A preferred embodiment of the sputtering arrangement 44 is illustrated in FIGS. 5 and 6. The arrangement 44 comprises three magnetically-enhanced sputtering structures or "racetracks", designated 64, 66, and 68, respectively. Each of the racetracks forms a continuous loop extending about a common axis 70, and in that sense may be described as being "concentric" with each other. The racetracks are individual planar magnetrons, separately controllable as to the rates at which the corresponding constituent elements are sputtered therefrom. They are combined in the concentric configuration of FIGS. 5 and 6 to produce a narrow device able to sputter the constituent elements of the layer 12 in any desired proportions.

Each racetrack comprises a source 72 containing at least one of the constituent elements of the layer 12, and a plurality of bar magnets 74. When the layer 12 is $CuInSe_2$, the sources 72 may be made of Cu, In, and Se, respectively. The sources are essentially coextensive with the corresponding racetracks and may comprise the appropriate materials in bar or tile form. Each source is supported by a plurality of holding blocks 76 of aluminum or other suitable non-magnetic material. The fluid conduits 56 described above in relation to FIG. 4 pass through the holding blocks in the direction of the racetrack loop, and the magnets 74 pass through the blocks in a transverse direction. Each source 72 and the corresponding holding blocks 76 are sandwiched between a pair of vertical pole pieces 80 extending continuously about the racetrack loop. The pole pieces abut opposite poles of the magnets 74 to conduct the lines of magnetic force to an area 82 directly above the source. The pole pieces 80 are preferably made of mild steel or other suitable ferromagnetic material.

Each of the racetracks also has a base plate 84 supported by a plurality of legs 86 positioned on insulator bases 88. The base plate 84 is preferably made of a ferromagnetic material and extends between the lower ends of the pole pieces 80 to complete the magnetic circuit therebetween. An external magnetic field is thus produced only in the area 82 above the source 72, limiting sputtering activity to the source 72. The base plates 84 of the racetracks 66 and 68 are provided with enlarged openings 90 for reception of the legs 86 of one or more of the other racetracks. The openings 90 are substantially greater in diameter than the legs 86, preventing electrical contact between the racetracks in this region. As shown in FIG. 6, the base plates 84 are spaced vertically from one another and the racetracks 64 through 68 are spaced apart laterally, causing the racetracks to be in electrical isolation from each other and from a floor or other supporting surface 92.

The magnets 74 are oriented such that one of the pole pieces 80 of each racetrack is a north pole and the other pole piece is a south pole. The lines of magnetic force thus extend from one of the pole pieces to another at every point around the racetrack, providing a continuous force field able to trap electrons in the area 82 during a sputtering operation. To minimize potential magnetic interaction between the magnetic circuits of the various racetracks, the magnets 74 of adjoining racetracks are positioned oppositely. Adjoining pole pieces 80 of different racetracks thus have similar polarities, essentially isolating the magnetic circuits of the racetracks.

Each of the racetracks thus comprises a separate planar magnetron which is effectively isolated both magnetically and electrically from the others. Electrical power for sputtering is introduced to the racetracks through the fluid conduits 56, each of the conduits 56 being connected to one of the power lines 54 of FIG. 4 to apply a preselected level of electric power to the corresponding source 72. The racetracks comprise separate cathodes for the application of electric power to the sputtering system. A plurality of auxiliary cooling lines 94, extending about the axis 70 at locations between the racetracks, act as anodes for the system.

Referring again to FIG. 4, the magnetron sputtering arrangements 44 can be up to approximately eight feet long for use on a commercial scale, enabling them to be used with a substrate up to approximately eight feet wide. The arrangements 44 may then be approximately ten inches wide, with each strip of source material being one inch wide. In this configuration, the lower surface of the substrate 22 may be spaced approximately 2½ to 4 inches above the magnetron arrangements, permitting the sputtered elements to be mixed through dispersion without reducing the rate of deposition.

In operation, one or more of the sputtering arrangements 44 are positioned within a chamber (not shown) which is evacuated and back-filled with argon or other suitable gas to a very low pressure. Electric power is supplied to the cathodes of the racetracks 64 through 68 at individually controllable levels to cause the onset of magnetron sputtering. The negative potential supplied to a particular cathode drives electrons out of the corresponding source 72 in an upward direction. The electrons are trapped above the source by the magnetic field and collide with argon atoms to produce a high energy plasma. Ar+ ions are drawn from the plasma by the negative potential of the cathode and impact the source material with a force sufficient to jar loose atoms of the source material. These "sputtered" atoms possess substantial kinetic energy and are directed essentially upwardly from the source. They are uncharged and virtually unaffected by either the potential of the source or the magnetic field within the area 82, permitting them to retain high kinetic energy as they pass upwardly to the surface of the substrate 22. The sputtered atoms impact the substrate with substantial kinetic energy, often giving them sufficient mobility within the deposited layer to assume favored positions in its structure. Proper control of sputtering rates from the sources 72 can produce a single phase layer of a multinary semiconductive material with a preselected composition gradient or "profile". The gradient is determined by the relative levels of electric power applied to the sources over time. In some cases, the sputtered atoms have sufficient kinetic and thermal energies to form a polycrystalline layer of the semiconductive material. For example, elemental co-sputtering of Cu, In and Se at temperatures of at least 250 degrees Celsius can produce a single phase chalcopyrite film of $CuInSe_2$. Crystal growth is preferably columnar in shape and produces very few grain boundaries across the direction of carrier travel. Due to the difficulty of controlling a sputtering source of pure Se in the solid phase, this process is most viable when Se is sputtered from a liquid source. However, the other elements must then be sputtered very rapidly to match the rate of Se deposition. This process is suitable for rapid, large scale commercial deposition, but is not easily scaled down to the laboratory level. Alternatively, the elements can be sputtered at room temperature, yielding an amorphous mix of atoms which must be heat treated if a chalcopyrite structure is desired. The atomic composition of the layer, as deposited, remains a function of the electric power to the cathodes, permitting the initial composition gradient to be carefully controlled.

The initial composition of the layer 12 is graded either by varying the electrical power levels to the cathodes or providing a number of magnetron sputtering arrangements 44, as shown in FIG. 4, with the proportions of sputtered elements differing between the arrangements. If the power levels are varied over time, the substrate 22 may remain stationary above the sputtering arrangement 44; however, in the configuration of FIG. 4, the substrate is conveyed over the sputtering arrangements.

The atoms sputtered from the sources 72 of a particular sputtering arrangement are effectively mixed in the distance between the sources and the substrate 22. The atoms are sputtered from the sources at random angles with the vertical, causing the flows of sputtered atoms to fan out and intermix on the way to the substrate. The racetracks 64 through 68 are narrow and closely spaced for this purpose. In addition, a heated shield 96 is angled inwardly from the periphery of the racetrack 68 to reflect sputtered atoms toward the inner two racetracks, aiding in mixing the atoms. The Se atoms are by far the most mobile of the sputtered atoms and are thus the logical choice for placement in the outer racetrack 68. They diffuse well to all points between the substrate 22 and the sputtering arrangement 44.

It will be understood that while the magnetron sputtering arrangements 44 of FIGS. 5 and 6 have been described primarily as having a different racetrack for each constituent element of the layer 12, it is not necessary that this be the case. One or more of the sources 72 may be an alloy of two or more constituent elements of the layer 12. For example, in the deposition of $CuInSe_2$, the source of the racetrack 64 may be an alloy of Cu and In for sputtering the two elements in a preselected fixed proportion determined by the proportion of Cu to In in the alloy. The racetrack 66 can then be used to sputter either Cu or In, permitting variation of the ratio of Cu to In in the sputtered layer by varying the power to the cathodes, and the racetrack 68 can be used to sputter Se. Alternatively, the racetrack 66 can be eliminated and a number of magnetron arrangements incorporating different alloys of Cu and In can be placed side-by-side in the manner of the apparatus 46 to sputter the constituent elements in a set of preselected fixed proportions determined by the proportions of elements in the targets.

In accordance with a major aspect of the present invention, when one of the constituents of the layer 12 is difficult to sputter in isolation it can sometimes be sputtered with greater control from a stable alloy containing another element of the layer. For example, Se is a semi-metal which is difficult to controllably sputter from the solid phase because of its low melting point. Under sputtering conditions, it tends to evaporate as it sputters, drastically reducing the level of control over film composition. However, Se can be sputtered in precisely controlled stoichiometric ratios from certain stable selenium alloys, including $Cu_2Se$ and $In_2Se_3$. Thus, the sources of the racetracks 64 and 66 used to deposit $CuInSe_2$ may be made of $Cu_2Se$ and $In_2Se_3$, respectively, permitting the Cu to In ratio to be controlled by the power to the two sources. The racetrack 68 can be eliminated or can be adapted to sputter Cu or In, alone. The latter configuration permits control of the proportion of each element in the film, including Se.

A further possibility for depositing $CuInSe_2$ is to sputter Cu and In, as described above, while depositing Se by thermal evaporation or other conventional means. Mixing of evaporated Se with the Cu-In vapor stream can be enhanced by using heated shields similar to the shield 96 of the arrangement 44. This method is feasible because Se is a very good diffuser. However, it does not produce a film of the quality achieved when Se is sputtered from stable alloys.

In demonstration of the method of the present invention, $CuInSe_2$/CdS solar cells have been fabricated experimentally from alloy targets containing Se. The alloys used in depositing the $CuInSe_2$ layer were $Cu_2Se$ and $In_2Se_3$. Sputtering was accomplished with side-by-side dc planar magnetrons of conventional design, having 4-inch round targets approximately ¼-inch thick. Deposition took place at room temperature (no substrate heat), in an atmosphere of argon at a pressure of approximately 8 millitorr. The applied voltage was between −450 and −500 volts DC and current was approximately ¼ to ½ ampere per target. Under these conditions, material would be deposited at a rate of approximately 10 angstroms per second on a stationary substrate positioned above the magnetron targets. However, actual deposition was accomplished using a planetary substrate holder, producing an actual deposition rate of between one and three angstroms per second. The resultant film was an amorphous mix of Cu, In and Se, in relative proportions determined by the electrical power to the targets. The film was deposited on a one-inch square alumina substrate to a total thickness of between 1.5 and 2 micrometers. The substrate was prepared with a suitable sputtered base contact prior to deposition.

A sharp gradation in the initial Cu to In ratio, similar to that described by Chen and Mickelsen, was provided in the $CuInSe_2$ layer by depositing the film in two layers of different composition. The first layer was deposited to approximately two-thirds of the total film thickness, at a Cu/In ratio of 1.02. It was therefore a p-type layer of low resistivity. A second layer was deposited with a Cu/In ratio of 0.675 by increasing the power to the $In_2Se_3$ target. The resulting material was n-type and relatively high in resistivity.

Before completion of the solar cell by applying an n-type CdS layer, an upper contact grid, and an AR coating over the $CuInSe_2$ film, as described in connection with Stages III–V, the film was heat treated to convert the amorphous mixture to crystalline (chalcopyrite) $CuInSe_2$. Heat treatment also caused diffusion within the film to remove the sharp composition gradient and homogenize the film at a macroscopic level. The resulting film is a high quality p-type $CuInSe_2$ film having the desired chalcopyrite structure and very few surface defects. The film may be inhomogenous at doping levels, but has been found to be entirely homogeneous as far as can be determined with conventional Auger mass spectroscopy. Although it is believed that the "as deposited" film had an overall Se concentration at least equal to the stoichiometric abundance of Se in $CuInSe_2$, heat treatment was accomplished in argon gas with approximately one percent $H_2Se$. Alternatively, it is believed that an atmosphere of pure argon, or argon and $H_2$, would be equally suitable for this purpose. The heat treatment was accomplished at 400 degrees Celsius, with a 20 minute heat-up to that temperature. The temperature of 400 degrees was maintained for two hours, followed by a slow cooling.

The alloy targets used to sputter the sample $CuInSe_2$ films were fabricated by melting the respective constituent elements together into the desired shape. Thus, the $Cu_2Se$ target was formed by melting two parts of copper together with one part of selenium and cooling the mixture. The $In_2Se_3$ target was formed by melting two parts of Indium together with three parts of selenium. However, the targets could also be fabricated using conventional hot pressing techniques.

The one-inch square solar cells prepared in the manner described above exhibit efficiencies of approximately six percent. The cells have the largest active area of any $CuInSe_2$/CdS cells known to applicants, and represent the highest reported efficiency for such cells produced by a sputtering process. This is true despite the fact that a great many parameters in the process have not yet been fully optimized, including parameters related to target fabrication, heat treatment, CdS deposition and grid line formation. The disclosed cells were also made with discrete planar magnetrons positioned side-by-side in a deposition environment, rather than with the concentric racetrack structure of the present invention. It is therefore possible to further improve the process by which the cells are made, for the purpose of improving cell efficiency. However, the viability of the process of the present invention for producing high quality solar cells in a commercially scalable manner has been clearly shown.

Figure 8:
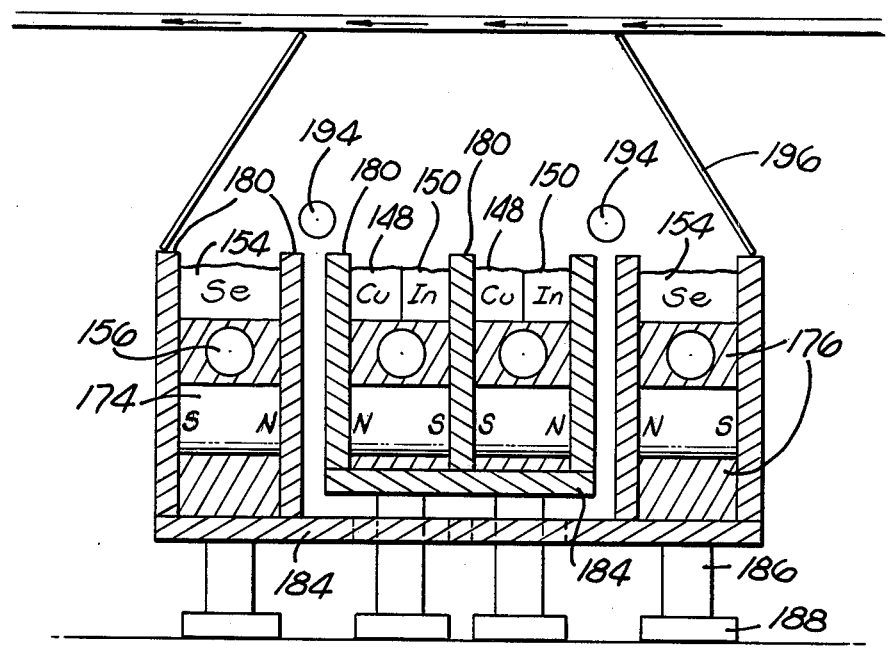
FIG. 8 is a vertical sectional view taken along the line 8—8 of FIG. 7.
Figure 7:
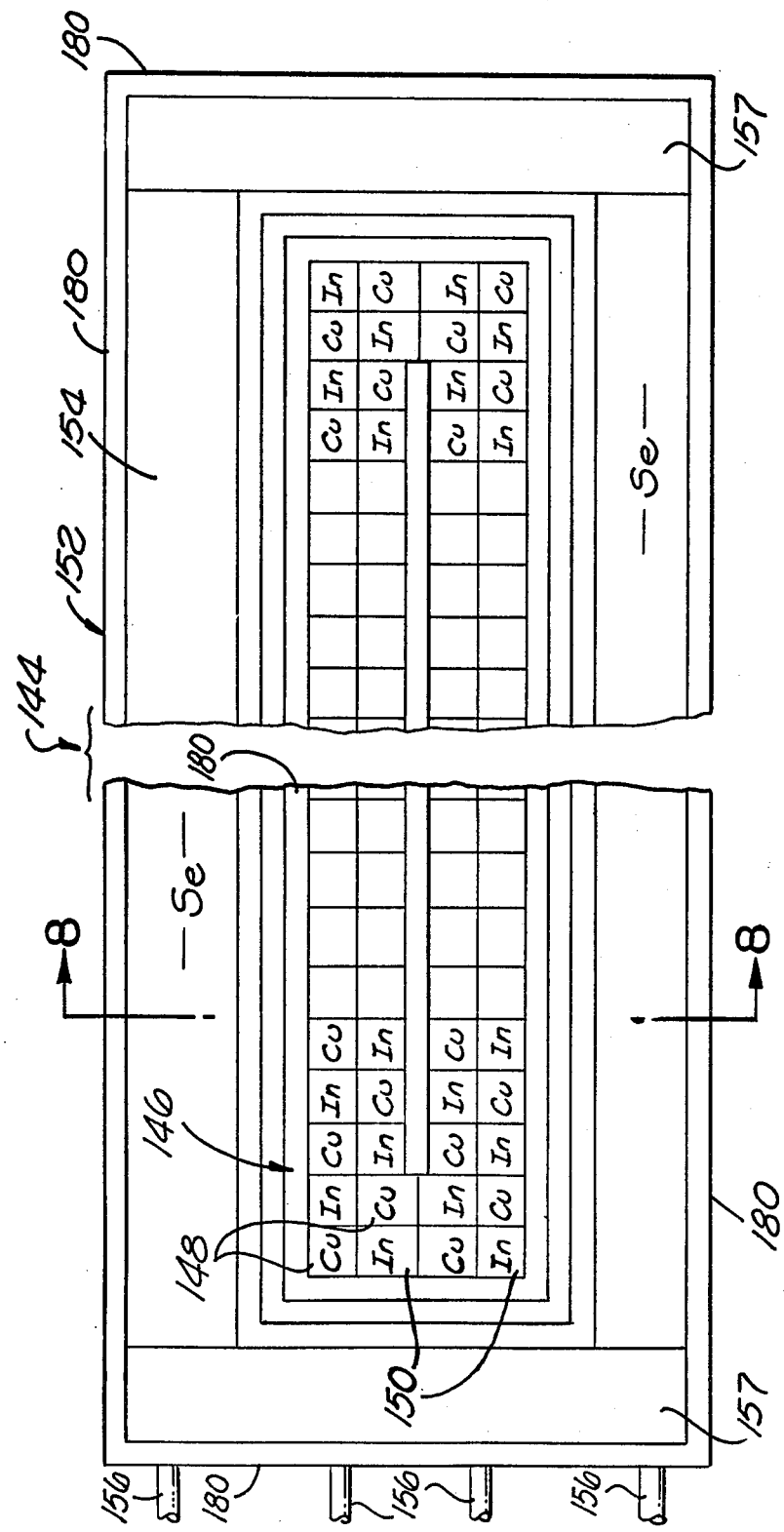
FIG. 7 is a fragmentary top plan view of a planar magnetron arrangement constructed in accordance with another embodiment of the present invention.

Referring now to FIGS. 7 and 8, there is shown an alternative embodiment of magnetron sputtering arrangement, generally designated 144. The sputtering arrangement 144 is suitable for use in the side-by-side configuration illustrated in FIG. 4 with regard to the arrangement 44, the principal difference being the source structure of the arrangement 144. That is, Cu and In are sputtered from a single racetrack 146 having a source comprising a plurality of Cu tiles or plates 148 alternated with In tiles or plates 150. A second racetrack 152 extends about the racetrack 146 for sputtering Se. A pair of elongated Se sources 154 extends lengthwise along the racetrack 152 on either side of the racetrack 146.

The end portions 157 of the racetrack 152 include a pair of graphite plates in place of the source material. Graphite is provided at these locations to eliminate undue sputtering of Se at the ends of the arrangement 144. Graphite is a very difficult element to sputter and will remain undisturbed under the conditions of the present method.

The sources 154 and the tiles 148 and 150 are supported on suitable holding blocks 176 which are similar to the holding blocks 76 described above in relation to the apparatus 44. In like manner, cooling water and a negative electrical potential are applied to the two racetracks through corresponding cooling lines 156, and magnetic fields are established above the sources by a plurality of bar magnets 174 and pole pieces 180. The pole pieces extend continuously about the racetracks 146 and 152 in the manner of the arrangement 44, with the magnets positioned at regular intervals therealong. The racetracks are also provided with base plates 184, legs 186 and insulator bases 188 for supporting the racetracks in an electrically isolated condition. These elements are similar to those described above in relation to the sputtering arrangement 44. Auxiliary cooling lines 194 provide an electrical anode for the completion of the electric circuit of the system, and a heated reflector shield 196 directs Se toward the substrate.

The sputtering arrangement 144 can be used in the side-by-side arrangement of FIG. 4 in essentially the same manner as the arrangement 44. However, the proportion of Cu to In sputtered from the arrangement 144 depends upon the relative abundance of the tiles 148 and 150 in the racetrack 146. The alternating tile arrangement not only provides excellent mixing of the sputtered atoms of Cu and In, but also permits the ratio of sputtered Cu and In atoms to be easily changed by varying the relative abundance of the tiles 148 and 150. In cases where the number of tiles is altered for this purpose, the pattern of tiles may, of course, no longer be strictly alternating.

The sputtering arrangement 144 may be dimensioned approximately the same as the sputtering arrangement 44, with the exception that the width of the arrangement will be somewhat less because one racetrack has been eliminated. The tiles 148 and 150 of the racetrack 146 are preferably approximately ½ inch square.

With regard to the sputtering arrangement 44, it should be noted that the sources 72 at the curved end portions of the racetracks may be replaced by graphite plates similar to the end portions 157 of the sputtering arrangement 144. This would minimize material loss from the ends of the sources and enhance the uniformity of distribution of sputtered material. However, it would also reduce the maximum width of substrate with which it can be used. The substitution of graphite or other non-sputtering material at the ends of the racetracks thus remains an option which can be used in some exacting circumstances, but which may not be desirable in many large scale production environments.

It will be understood that a number of other variations on the structures and methods described above are possible without deviating from the scope of the present invention. For instance, the magnets 74 and 174 may be of any conventional type, including electromagnets. Similarly, the power applied to the various cathodes or racetracks described above can take the form of either ac or dc power. Generally, dc power is more electrically efficient while high frequency ac power is required when sputtering insulators. Similarly, the source materials can be sputtered from a molten state, with a very substantial increase in sputtering rate. To accomplish this, power to the cathodes can be greatly increased or a thermal insulator can be placed between the sources and the cooling lines 78 or 178.

In the context of the magnetron sputtering arrangements 44 and 144, a number of process parameters are considered to be particularly advantageous for performing the method of the present invention:

Gas pressure (argon): $10^{-3}$ to $8 \times 10^{-3}$ Torr

Magnetic field strength: approximately 200 gauss at a distance of one inch above the source Cathode potential: $-450$ to $-900$ volts DC Resultant deposition rates: approximately 4,000 Å per minute per cathode (at 2½ inches from source), or much higher when sputtering from the liquid phase.

Rate of substrate travel: 2 feet per minute

It will be further understood that although portions of the discussion herein have dealt specifically with the sputtering of $CuInSe_2$ layers, the method and apparatus of the present invention is applicable generally to the production of composition-graded layers of semiconductor materials in the class of I-III-VI$_2$ ternary chalcopyrite compounds, as well as some related quaternary materials. The ternary chalcopyrite compounds other than $CuInSe_2$ to which the present invention relates include, without limitation: $CuGaSe_2$, $CuInS_2$, $CuInTe_2$, $AgInS_2$, $AgInSe_2$, $AgInTe_2$, $AgGaSe_2$ and $AgGaTe_2$.

From the above, it can be seen that there has been provided an improved method and apparatus for depositing a layer of semiconductor material in which the composition of the material is accurately controllable as a function of depth.

The appended claims are intended to cover all variations and adaptations falling within the true scope and spirit of the present invention.

What is claimed is:

1. A method for use in the manufacture of photovoltaic cells having a film of a Cu-ternary semiconductor compound made up of a plurality of constituent elements, comprising the steps of:

magnetron sputtering at least two constituent elements of the Cu-ternary compound simultaneously onto a substrate in a first preselected proportion; and subsequently magnetron sputtering said at least two constituent elements simultaneously onto the substrate in at least one other preselected proportion;

whereby a composite sputtered film of the Cu-ternary compound having a preselected concentration gradient of at least one of the constituent elements is produced on the substrate.

2. The method of claim 1 wherein the sputtering steps are performed at room temperature and the method further comprises the step of subsequently heat treating the composite sputtered film to produce a macroscopically homogeneous film.

3. The method of claim 2 wherein the heat treatment is carried out at a temperature of at least approximately 350 degrees Celsius.

4. The method of claim 1 wherein said Cu-ternary semiconductor compound is a chalcopyrite containing at least one Group III element, and the preselected concentration gradient comprises a gradient in the ratio of the concentration of Cu to the concentration of the Group III element.

5. The method of claim 4 wherein the Cu-ternary semiconductor compound includes a Group VI element and the constituent elements are sputtered from stable alloys containing the Group VI element.

6. The method of claim 5 which further comprises the step of subsequently heat treating the film in a reactive atmosphere containing the Group VI element.

7. The method of claim 4 wherein the semiconductor compound is $CuInSe_2$ and the constituent elements are sputtered from stable alloy targets containing Se.

8. The method of claim 7 wherein the alloy targets comprise $Cu_2Se$ and $In_2Se_3$, respectively.

9. The method of claim 1 wherein the step of sputtering the constituent elements in at least one other preselected proportion comprises varying the relative sputtering rate of at least one of the constituent elements during the sputtering process.

10. The method of claim 9 wherein a plurality of planar magnetron cathodes containing said at least two constituent elements, respectively, are positioned in close proximity to one another, and the relative sputtering rate of at least one of said constituent elements is varied by individually varying the electrical power applied to the cathodes.

11. The method of claim 1 wherein a first set of planar magnetron cathodes respectively containing said at least two constituent elements is positioned at a first location, and power is applied thereto at a first preselected set of levels to sputter said at least two constituent elements in said first preselected proportion; and at least one other set of planar magnetron cathodes respectively containing said at least two constituent elements is positioned at another location, and power is applied thereto at another preselected set of levels to sputter said at least two constituent elements in one of said other preselected proportions; said magnetron sputtering steps including moving the substrate sequentially past the first set of cathodes and said at least one other set of cathodes in mass transfer proximity thereto.

12. The method of claim 11 which further comprises combining said at least two constituent elements into a stable alloy in the production of at least one of the cathodes of each set, whereby the first preselected sputtering proportion is controlled, in part, by the stoichiometric ratio of elements in said alloy.

13. The method of claim 1 wherein the concentration gradient of the composite film, as deposited, is a smoothly varying function of film depth.

* * * * *